United States Patent
Ryu et al.

(10) Patent No.: US 7,507,657 B2
(45) Date of Patent: Mar. 24, 2009

(54) METHOD FOR FABRICATING STORAGE NODE CONTACT IN SEMICONDUCTOR DEVICE

(75) Inventors: Cheol-Hwi Ryu, Kyoungki-do (KR); Jong-Han Shin, Kyoungki-do (KR)

(73) Assignee: Hynix Semiconductor, Inc. (KR)

( * ) Notice: Subject to any disclaimer, the term of this patent is extended or adjusted under 35 U.S.C. 154(b) by 421 days.

(21) Appl. No.: 11/150,759

(22) Filed: Jun. 9, 2005

(65) Prior Publication Data

US 2006/0141770 A1 Jun. 29, 2006

(30) Foreign Application Priority Data

Dec. 28, 2004 (KR) .................. 10-2004-0113542

(51) Int. Cl.
*H01L 21/4763* (2006.01)
(52) U.S. Cl. .................. 438/633; 438/692; 438/634; 257/E21.583
(58) Field of Classification Search .......... 438/633, 438/634, 645, 595, 692; 257/E21.583, E21.489, 257/E21.691
See application file for complete search history.

(56) References Cited

U.S. PATENT DOCUMENTS

| 5,605,855 | A | * | 2/1997 | Chang et al. | ............ | 438/291 |
| 2005/0130414 | A1 | * | 6/2005 | Choi et al. | ............ | 438/672 |

FOREIGN PATENT DOCUMENTS

| KR | 2002-21408 | 3/2002 |
| KR | 2003-0058263 | 7/2003 |

* cited by examiner

*Primary Examiner*—Caridad M Everhart
(74) *Attorney, Agent, or Firm*—Blakely, Sokoloff, Taylor & Zafman (57) ABSTRACT

Disclosed is a method for fabricating a plurality of storage node contacts in a semiconductor device capable of minimizing an influence of a slurry residue and planarizing cruspidal patterns caused during a storage node contact isolation process. In accordance with the present invention, a chemical mechanical polishing (CMP) process that is the last process of the storage node contact isolation process is performed by using the slurry without the selectivity or the reverse selectivity, thereby removing the plurality of cruspidal patterns at every interface of the plurality of bit line patterns BL and the plurality of storage node contacts.

23 Claims, 7 Drawing Sheets

METHOD FOR FABRICATING STORAGE NODE CONTACT IN SEMICONDUCTOR DEVICE

FIELD OF THE INVENTION

The present invention relates to a method for fabricating a semiconductor device; and more particularly, to a method for fabricating a storage node contact.

DESCRIPTION OF RELATED ARTS

In general, an electrical operation between a capacitor and a bit line is possible through a contact connected to a source/drain region of a transistor during fabricating a semiconductor device.

Recently, as a scale of integration of a semiconductor device has increased, a space between conductive lines such as gate lines has been narrow. Accordingly, a contact process margin has decreased as well. In order to secure the contact process margin, a self aligned contact (SAC) process has been performed.

FIGS. 1A to 1E are cross-sectional views illustrating a conventional method for fabricating a plurality of storage node contacts in a semiconductor device.

Figure 1A:
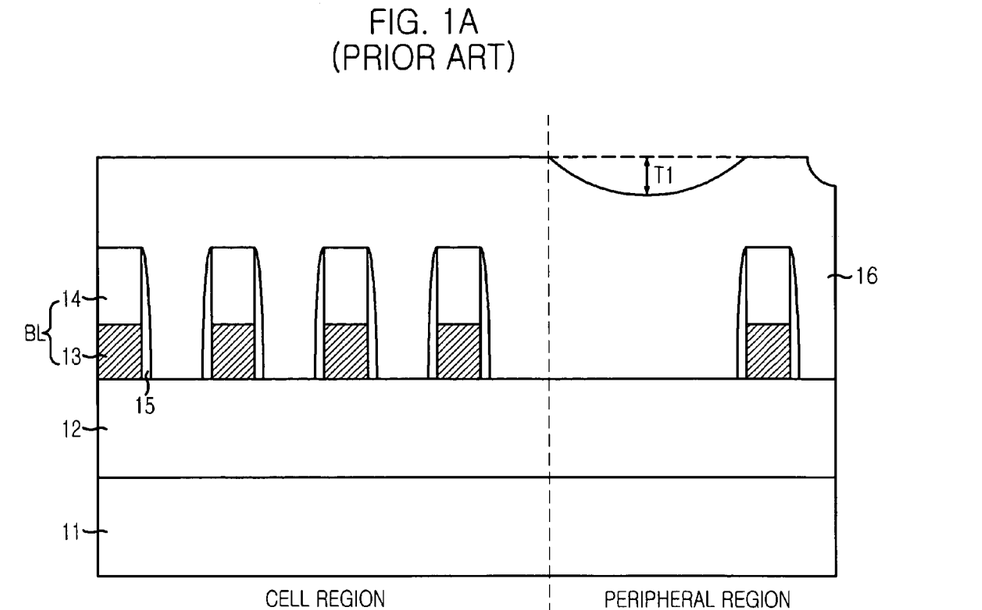
FIGS. 1A to 1E are cross-sectional views illustrating a conventional method for fabricating a plurality of storage node contacts in a semiconductor device.

Referring to FIG. 1A, a first inter-layer insulation layer 12 is deposited on a substrate completed with a predetermined process. Herein, the first inter-layer insulation layer 12 is referred as an ILD1. Afterwards, a plurality of bit line patterns (BL) are formed by sequentially stacking a tungsten bit line 13 and a hard mask nitride layer 14. Herein, the hard mask nitride layer 14 is made of a plasma enhanced chemical vapor deposition nitride layer. Hereinafter, the plasma enhanced chemical vapor deposition nitride layer is referred as a PE CVD nitride layer.

Next, a plurality of bit line spacers 15 in contact with both lateral sides of each bit line pattern (BL) are formed. Afterwards, a second inter-layer insulation layer 16 is deposited until sufficiently filling spaces between the plurality of bit line patterns (BL). Herein, the plurality of bit line spacers 15 are made of a low pressure chemical vapor deposition nitride layer. Hereinafter, the second inter-layer insulation layer is referred as an ILD2 and the low pressure chemical vapor deposition nitride layer is referred as a LP CVD nitride layer.

Subsequently, a first chemical mechanical polishing process is performed to the ILD2 16, thereby planarizing the ILD2. Hereinafter, the first chemical CMP process performed to the ILD2 is referred as a first ILD2 CMP process.

Figure 1B:
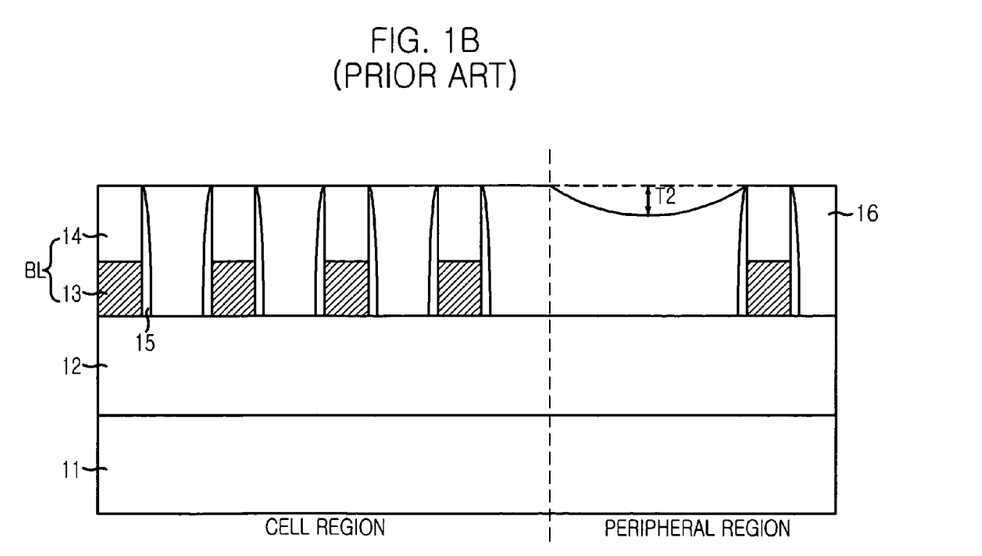

Referring to FIG. 1B, a second chemical mechanical polishing process is performed to the ILD2 16 completed with the first ILD2 CMP process for the purpose of stopping the polishing process on upper portions of the plurality of bit line patterns BL. Hereinafter, the second chemical mechanical polishing process is referred as a second ILD2 CMP process.

Accordingly, the ILD2 16 uniformly remains between the plurality of bit line patterns BL and does not remain on the upper portions of the plurality of bit line patterns BL.

Figure 1C:
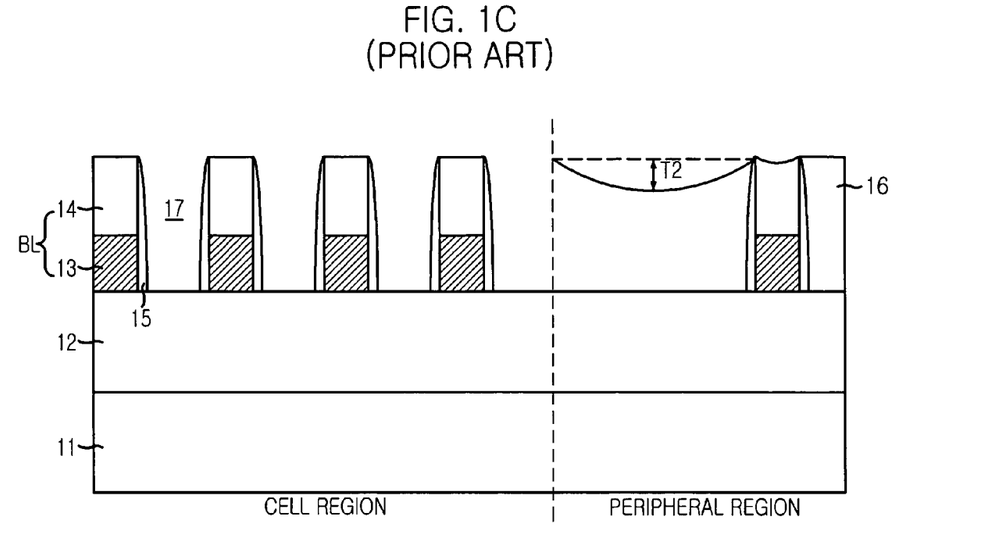

As shown in FIG. 1C, a self aligned contact (SAC process) selectively etching the ILD2 16 between the plurality of bit line patterns BL is employed, thereby forming a plurality of storage node contact holes 17 opening an upper portion of the substrate 11 between the plurality of bit lines BL.

Figure 1D:
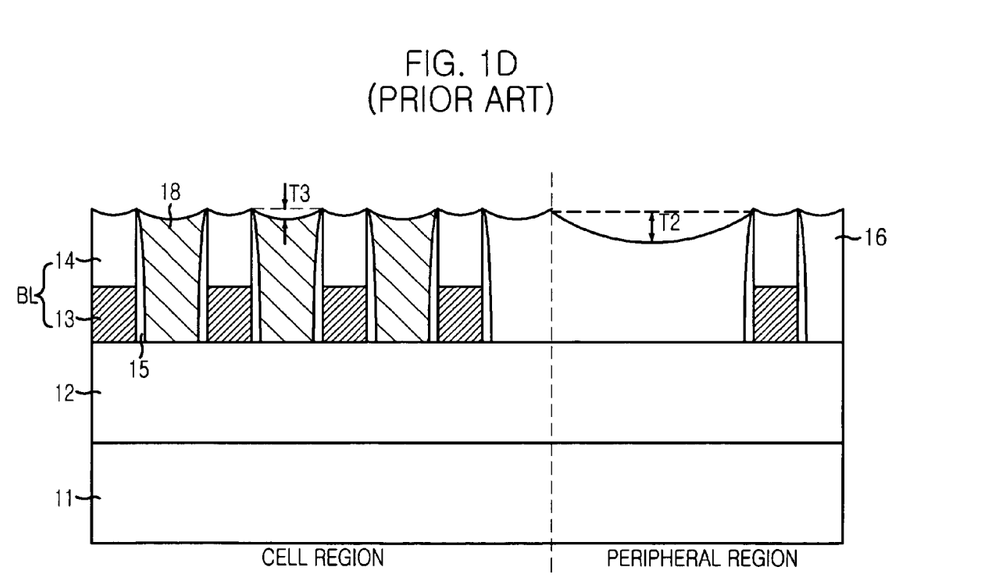

As shown in FIG. 1D, a polysilicon layer is deposited into all surfaces until filling the plurality of storage node contact holes 17. Afterwards, a polysilicon layer isolation process using an etch back process is performed, thereby forming a plurality of storage node contacts 18 isolated from each other by being buried between the plurality of bit line patterns BL.

Figure 1E:
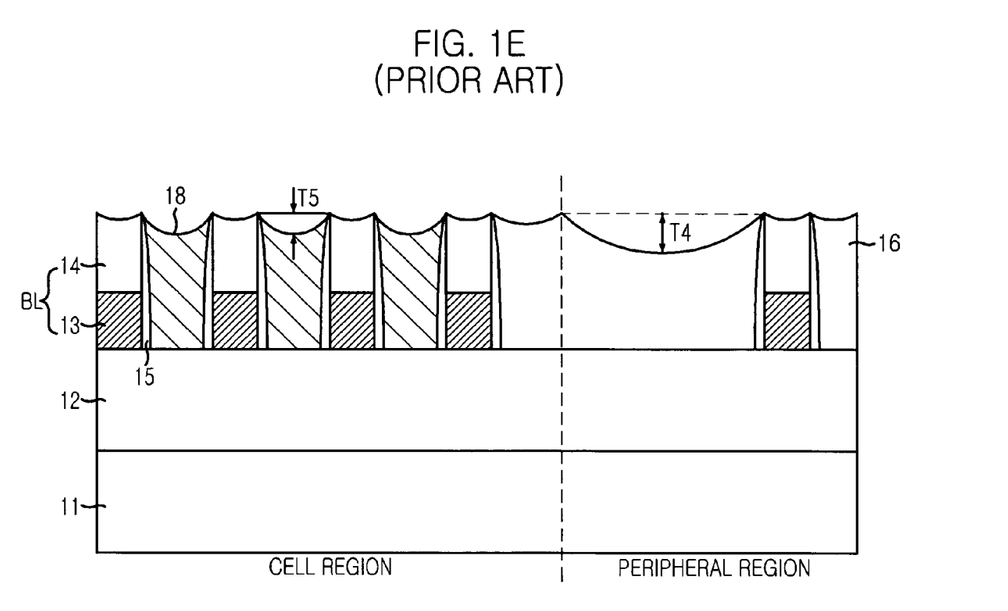

As shown in FIG. 1E, a CMP process is performed to the plurality of storage node contacts 18 again.

As described above, a conventional method performs the second ILD2 CMP process stopping the polishing process on the upper portions of the plurality of bit line patterns BL for settling a dishing problem of a peripheral region with a low pattern density and maintaining a planarization throughout a wafer. Accordingly, a dishing problem T1 generated in the peripheral region with the low pattern density can be reduced as much as a dishing problem T2.

Afterwards, an etch back process is performed to isolate the plurality of storage node contacts 18. At this time, due to a difference between an etch selectivity of the PE CVD nitride layer used as the hard mask of the plurality of bit line patterns BL and an etch selectivity of the LP CVD nitride layer used as the plurality of bit line spacers during the etch back process, cruspidal patterns are formed at every interface between the plurality of bit line patterns BL and the plurality of storage node contacts 18. Accordingly, a dishing T3 of the plurality of storage node contacts is generated.

In order to solve the dishing problem, an additional CMP process is employed by using a slurry for an oxide layer. That is, a storage node contact isolation process is performed in two steps by using the etch back process and the CMP process.

However, even though the conventional method performs the CMP process to remove the cruspidal patterns, the cruspidal patterns still remain and even induce a problem of deteriorating the dishing problem of the plurality of storage node contacts. That is, since a polishing speed of the polysilicon layer used as the plurality of storage node contacts 18 is faster than that of the ILD2 16, the hard mask nitride layer 14 and the plurality of bit line spacers 15, the dishing problem of the plurality of storage node contacts 18 is degraded as much as a dishing T5, i.e., T5>T3. Also, slurry impurities remain in the dishing T5 and thus, these slurry impurities cannot be easily removed through a subsequent cleaning process, thereby generating a contact fail.

Furthermore, there is another problem that the dishing of the peripheral region with the low pattern density is much more deteriorated as much as dishing T4, i.e., T4>T2.

SUMMARY OF THE INVENTION

It is, therefore, an object of the present invention to provide a method for fabricating a plurality of storage node contacts in a semiconductor device capable of minimizing an influence of a slurry residue and planarizing cruspidal patterns caused during a storage node contact isolation process.

In accordance with one aspect of the present invention, there is provided a method for fabricating a plurality of storage node contacts in a semiconductor device, including the steps of: forming a first inter-layer insulation layer on a semi-finished substrate; forming a plurality of bit line patterns including a hard mask nitride layer on the inter-layer insulation layer; forming a plurality of nitride based bit line spacers in contact with both lateral sides of the plurality of bit line patterns; forming a second inter-layer insulation layer filling gaps between the plurality of bit line patterns; planarizing the second inter-layer insulation layer by performing a first chemical mechanical polishing process to the second inter-layer insulation layer two times until the polishing is stopped on surfaces of the plurality of bit line patterns; forming a plurality of storage node contact holes opening a surface of the substrate between the plurality of bit line patterns by selectively etching the first and the second inter-layer insulation layers; forming a conductive layer filling the plurality of storage node contact holes; forming a plurality of storage node contacts by performing an etch back to the conductive layer; and additionally performing a second chemical mechanical polishing process to the second inter-layer insulation layer to remove the plurality of cruspidal patterns generated during performing the etch back to the conductive layer by using a slurry having a polishing speed identical with surrounding materials of the cruspidal patterns.

In accordance with another aspect of the present invention, there is provided a method for fabricating a plurality of storage node contacts in a semiconductor device, including the steps of: forming a first inter-layer insulation layer on a substrate; forming a plurality of bit line patterns including a hard mask nitride layer on the inter-layer insulation layer; forming a plurality of nitride based bit line spacers in contact with both lateral sides of the plurality of bit line patterns; forming second inter-layer insulation layer filling gaps between the plurality of bit line patterns; planarizing the second inter-layer insulation layer by performing a first chemical mechanical polishing process to the second inter-layer insulation layer two times until the polishing is stopped on surfaces of the plurality of bit line patterns; forming a plurality of storage node contact holes opening a substrate of the substrate between the plurality of bit line patterns by selectively etching the first and the second inter-layer insulation layers; forming a conductive layer filling the plurality of storage node contact holes; forming a plurality of storage node contacts by performing an etch back to the conductive layer; and additionally performing a second chemical mechanical polishing process to the second inter-layer insulation layer to remove the plurality of cruspidal patterns generated during performing the etch back to the conductive layer by using a slurry having a polishing speed faster than a polishing speed of surrounding materials of the cruspidal patterns.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on a preferred embodiment of the present invention will be provided with reference to the accompanying drawings.

Figure 2:
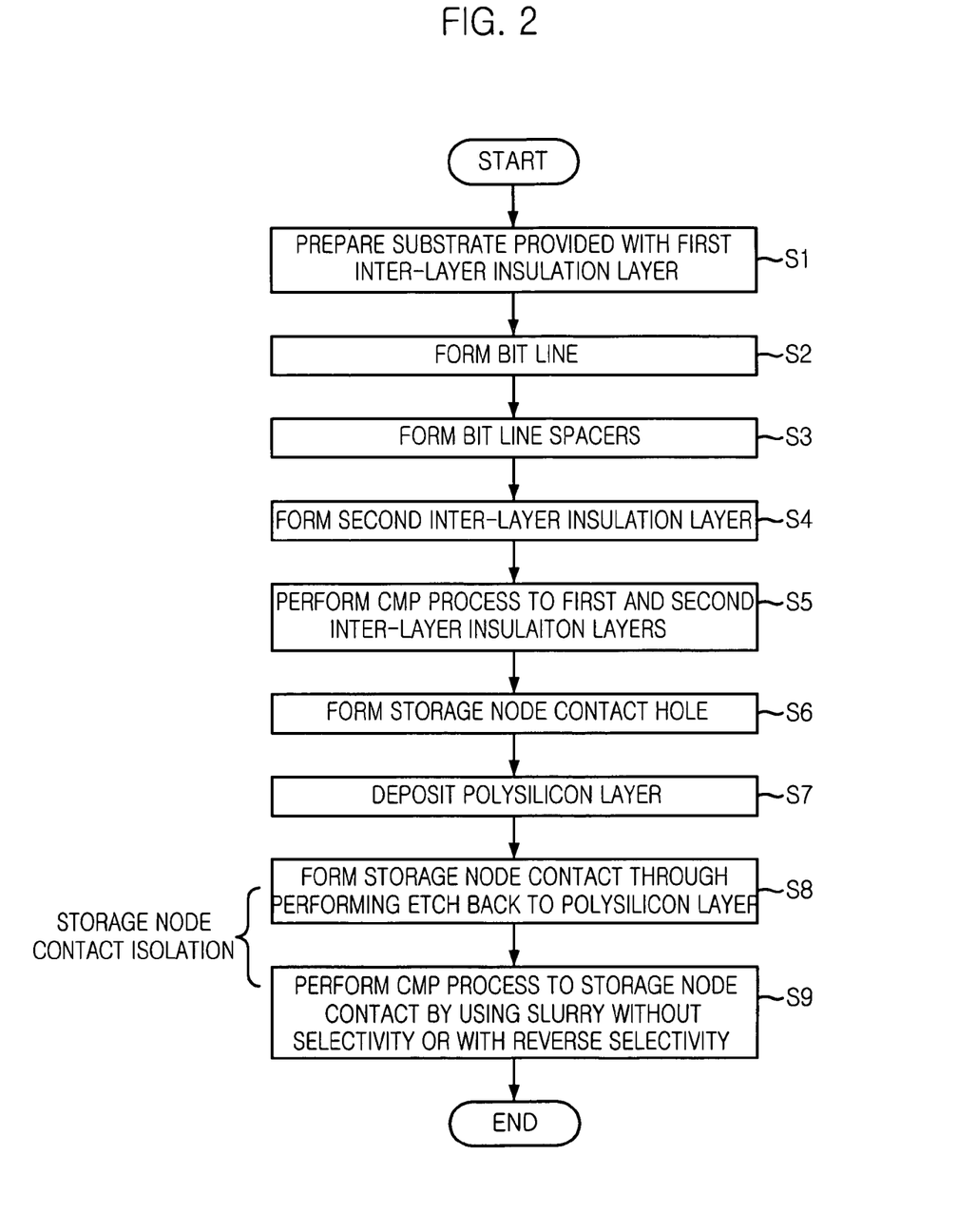
FIG. 2 is a flowchart illustrating a method for fabricating a storage node contact in a semiconductor device in accordance with the present invention.

FIG. 2 is a flowchart illustrating a method for fabricating a storage node contact in a semiconductor device in accordance with the present invention.

Referring to FIG. 2, the method for fabricating the storage node contact in the semiconductor device in accordance with the present invention is performed in the steps of preparing a substrate provided with a first inter-layer insulation layer at step S1, forming a bit line pattern at step S2, forming a bit line spacer at step S3, forming a second inter-layer insulation layer at step S4, performing a first and a second chemical mechanical polishing (CMP) processes to the second inter-layer insulation layer at step S5, forming a storage node contact hole at step S6, depositing a polysilicon layer at step S7, forming a storage node contact through an etch back process at step S8 and performing a storage node contact CMP process by using a slurry without a selectivity or with a reverse selectivity. Hereinafter, the first and the second inter-layer insulation layers are referred as an ILD1 and an ILD2, respectively. Also, the first and the second CMP processes performed to the ILD2 are referred as a first ILD2 CMP process and a second ILD2 CMP process, respectively.

As illustrated in FIG. 2, the present invention performs a storage node contact isolation process in two steps of forming the storage node contact through the etch back process at step S8 and performing the storage node contact CMP process at step S9.

Herein, the storage node contact CMP process at step S9 is performed by using the slurry without the selectivity or with the reverse selectivity. That is, the slurry without the selectivity or with the reverse selectivity defines that there is not the selectivity with respect to the ILD2 made of an oxide layer, the storage node contact made of a polysilicon layer and a bit line hard mask/the bit line spacer made of a nitride layer; or a polishing speed of the nitride layer is faster than that of the oxide layer and the polysilicon layer. Herein, the slurry without the selectivity with respect to the oxide layer, the polysilicon layer and the nitride layer indicates a slurry performing the CMP process in the identical polishing speed with respect to all of the oxide layer, the polysilicon layer rand the nitride layer.

As described above, if the storage node contact CMP process is performed by using the slurry without the selectivity or with the reverse selectivity at step S9, a cruspidal pattern generated at an interface between the bit line and the storage node contact caused by a difference in the selectivity during an etching process is planarized in a cell region. Furthermore, a dishing of the storage node contact is reduced and slurry impurities do not remain, thereby obtaining a dishing free planarization.

For a peripheral region, a dishing in the peripheral region with a low pattern density is reduced compared with a dishing generated during the second ILD2 CMP process and thus, a wide planarization is obtainable by using the slurry without the selectivity.

Hereinafter, FIGS. 3A to 3E are cross-sectional views illustrating a method for fabricating a plurality of storage node contacts in a semiconductor device in accordance with the present invention.

Figure 3A:
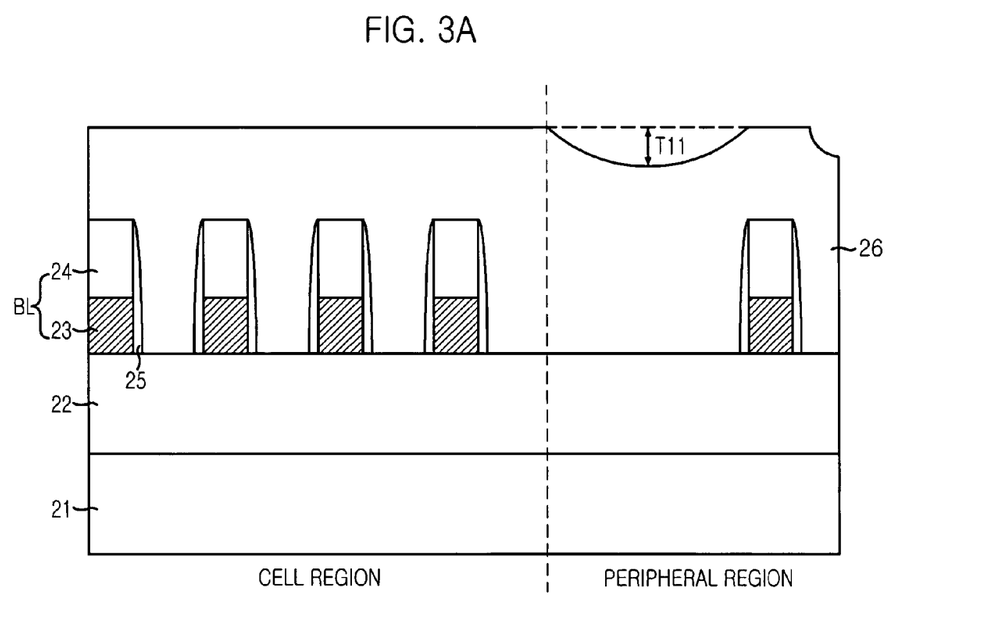
FIGS. 3A to 3E are cross-sectional views illustrating a method for fabricating a plurality of storage node contacts in a semiconductor device in accordance with the present invention.

As shown in FIG. 3A, an ILD1 is deposited on an upper portion of a substrate 21 completed with a predetermined process and provided with a cell region and a peripheral region. Herein, the substrate 21 can be either a silicon substrate or a silicon substrate provided with a landing plug. The ILD1 22 is made of a silicon oxide based layer such as a borophosphosilicateglass (USG) layer, an undoped silicate glass (USG) layer, a tetraethylorthosilicate (TEOS) layer and a high-density-plasma (HDP) oxide layer.

Subsequently, a plurality of bit line patterns BL formed by sequentially stacking a tungsten bit line 23 and a hard mask nitride layer 24 are formed on the ILD1 22. Herein, the hard mask nitride layer 24 is made of a plasma enhanced chemical vapor deposition nitride layer. Hereinafter, the plasma enhanced chemical vapor deposition nitride layer is referred as a PE CVD nitride layer.

The cell region indicates a region where a transistor and a capacitor are formed in a dynamic random access memory (DRAM), thereby showing a high pattern density of a bit line pattern. The peripheral region is a region where only a transistor is formed, thereby showing a low pattern density of a bit line pattern.

Next, a plurality of bit line spacers 25 in contact with both lateral sides of each of the plurality of the bit line patterns BL are formed. Afterwards, an ILD2 26 is deposited on all surfaces until filing spaces between the plurality of bit line patterns BL. Herein, the plurality of bit line spacers 25 are made of a low pressure chemical vapor deposition nitride layer. Hereinafter, the low pressure chemical vapor deposition nitride layer is refereed as a LP CVD nitride layer. The ILD2 26 is made of a silicon oxide based layer such as a BPSG layer, an USG layer, a TEOS layer and a HDP oxide layer.

Continuously, a first CMP process is performed to the ILD2 26, thereby planarizing the ILD2 26. Hereinafter, the first CMP process performed to the ILD2 is referred as a first ILD2 CMP process.

After performing the first ILD2 CMP process, the ILD2 26 is uniformly planarized in the cell region with the high pattern density. However, a dishing T11 is generated in the peripheral region with the low pattern density.

Figure 3B:
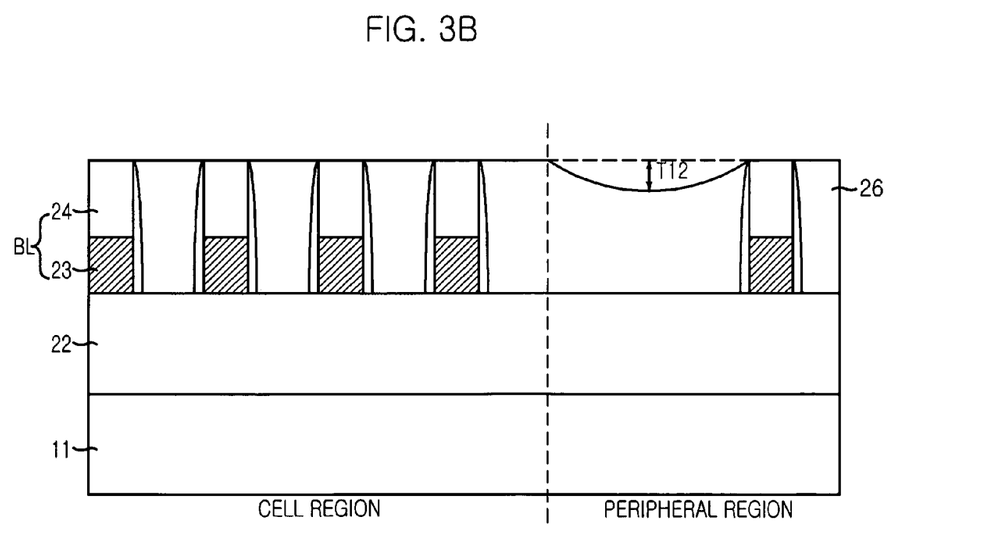

Referring to FIG. 3B, in order to reduce the dishing T11 generated in the peripheral region, a second CMP process is performed to the ILD2 26 completed with the first ILD2 CMP process for the purpose of stopping the polishing process on surfaces of the plurality of bit line patterns BL, i.e., a hard mask nitride layer 24, thereby planarizing the ILD2 26. Hereinafter, the second CMP process performed to the ILD2 26 is referred as a second ILD2 CMP process.

Accordingly, after the second ILD2 CMP process, the hard mask nitride layer 24 that is the most top layer of the plurality of bit line patterns BL is exposed. The ILD2 26 uniformly remains between the plurality of bit line patterns BL and does not remain upper portions of the plurality of bit line patterns BL.

As described above, even though the second ILD2 CMP process is performed, it cannot be avoidable to generate a softened dishing T12 compared with the dishing T11 generated after the first ILD2 CMP process, i.e., T12>T11.

Hereinafter, detailed descriptions about a slurry and polishing conditions required for the first and the second ILD2 CMP processes are as follows.

First, a pH factor of the slurry ranges from approximately 6 to approximately 11. A polishing selectivity is maintained in a ratio of approximately 1 part of the oxide layer to approximately 20 to approximately 50 parts of the nitride layer.

An abrasive included in the slurry can be selected from a material consisting of silicon oxide ($SiO_2$), aluminum oxide ($Al_2O_3$), cerium oxide ($CeO_2$) and zirconium oxide ($ZrO_2$).

A polishing pressure during the CMP process ranges from approximately 1 psi to approximately 10 psi and a speed of a polishing table ranges from approximately 10 rpm to approximately 100 rpm.

Figure 3C:
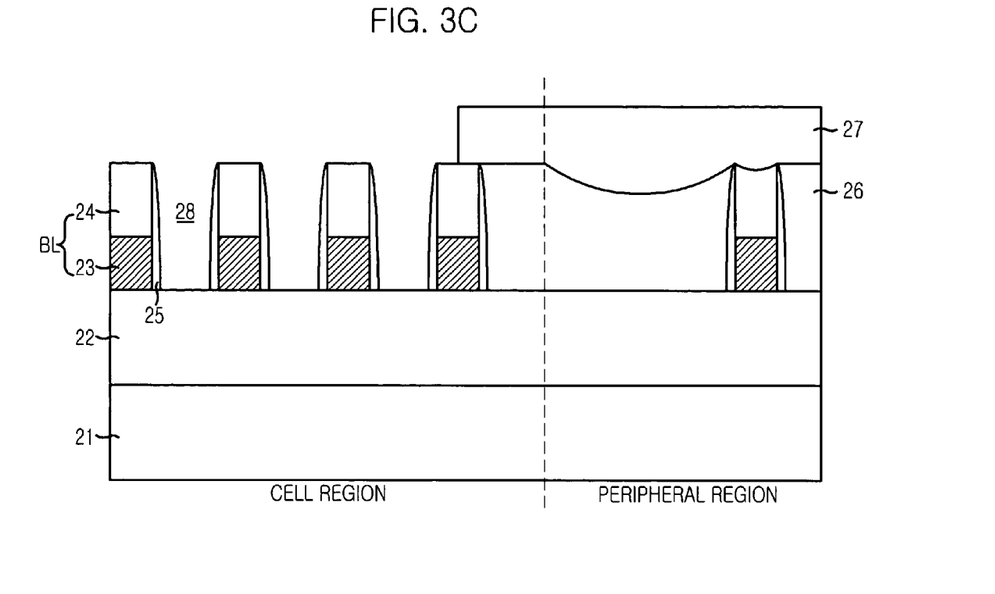

Referring to FIG. 3C, a self aligned contact (SAC) process selectively etching the ILD1 22 and the ILD2 26 placed between the plurality of bit line patterns BL is performed, thereby forming a plurality of storage node contact holes 28 opening a surface of the substrate between the plurality of bit line patterns BL.

The SAC process for forming the plurality of storage node contact holes is performed only in the cell region. Accordingly, a contact mask 27 using a photoresist layer is formed on an upper portion of the peripheral region in advance and thus, the etching process is not performed in the peripheral region.

Meanwhile, the SAC process for forming the plurality of storage node contact holes 28 can be employed by using a hard mask material. That is, the hard mask is formed in advance and then, a contact mask is formed on the hard mask. Afterwards, the hard mask is etched with use of the contact mask and then, the ILD2 26 is etched by using the hard mask as an etch barrier.

The hard mask material used for forming the plurality of storage node contact holes 28 is made of a polysilicon layer or a nitride layer selected from a group consisting of silicon nitride (SiN), titanium (TiN), aluminum nitride (AlN), boron nitride (BN) and tantalum nitride (TaN). The hard mask material forms the plurality of storage node contact holes in a thickness of approximately 100 Å to approximately 5,000 Å through one of a sputtering method, a CVD method and an atomic layer deposition (ALD) method.

Figure 3D:
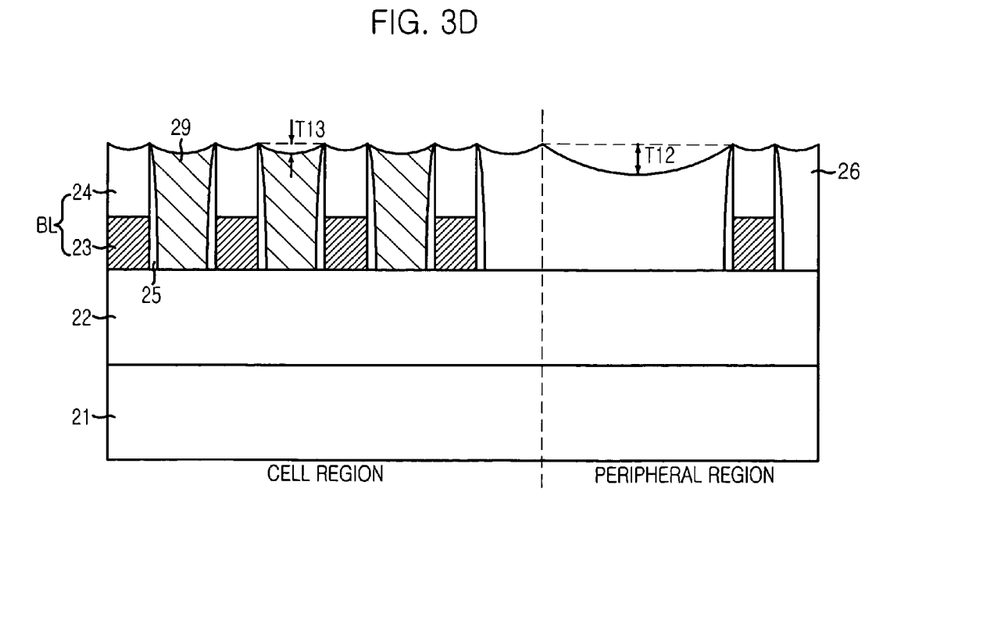

Referring to FIG. 3D, the contact mask 27 is removed and then, the polysilicon layer is deposited on all surfaces until filling the plurality of storage node contact holes 28. Afterwards, a polysilicon layer isolation process is performed by using an etch back process of the polysilicon layer, thereby forming a plurality of storage node contacts 29 isolated from each other by being buried between the plurality of bit line patterns BL.

After forming the plurality of storage node contacts 29 through the etch back process of the polysilicon layer, cruspidal patterns are formed at every interface between the plurality of bit line patterns BL and the plurality of storage node contacts 29 due to a difference in an etching selectivity of the PE CVD nitride layer used as the hard mask nitride layer 24 of the plurality of bit line patterns BL and the LP CVD nitride layer used as the plurality of bit line spacers 25. Accordingly, a dishing T3 of the plurality of storage node contacts 29 is generated due to the cruspidal patterns.

Figure 3E:
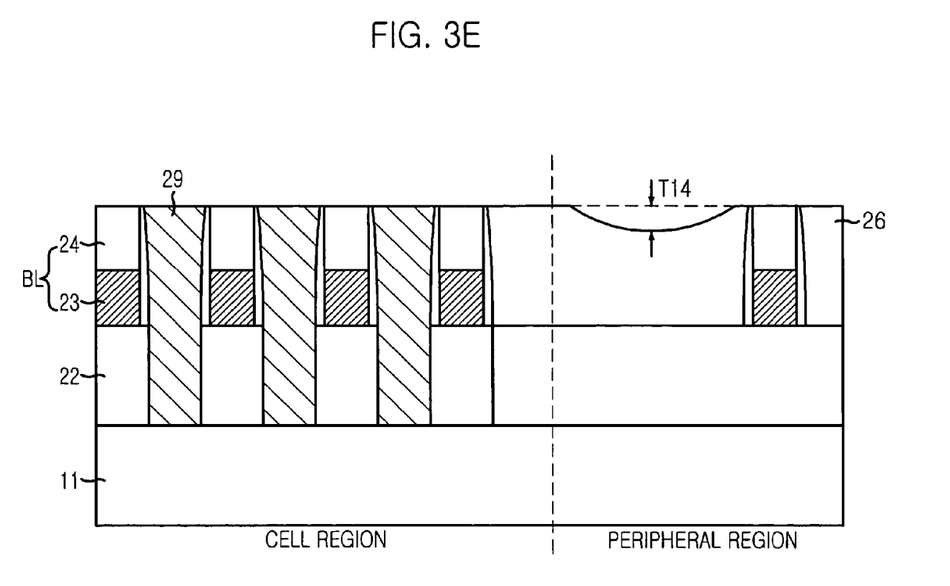

Referring to FIG. 3E, in order to soften the dishing T13 of the plurality of storage node contacts 29, the CMP process, i.e., a storage node contact CMP process, is performed to the plurality of storage node contacts 29 again.

The storage node contact CMP process can be performed by using a slurry without the selectivity or with a reverse selectivity. That is, the slurry without the selectivity or with the reverse selectivity means that there is not the selectivity with respect to the polysilicon layer used for the plurality of storage node contacts 29 and the PE CVD nitride layer/the LP CVD nitride layer used for the hard mask nitride layer used as the hard mask nitride layer 24 and the plurality of bit line spacers 25; or a polishing speed of the nitride layer is faster than that of the polysilicon layer. Herein, the slurry without the selectivity with respect to the oxide layer, the polysilicon layer and the nitride layer is a slurry performing the CMP in the identical polishing speed with respect to all of the oxide layer, the polysilicon layer and the nitride layer.

If the storage node contact CMP process is performed by using the slurry without the selectivity or with the reverse selectivity, the cruspidal patterns generated at every interface between the plurality of bit line patterns BL and the plurality of storage node contacts 29 caused by a difference in the selectivity of the etching process can be planarized.

Furthermore, by using the slurry without the selectivity or with the reverse selectivity during the storage node contact CMP process, the dishing of the plurality of storage node contacts 29 is removed. Also, slurry impurities do not remain and thus, it is possible to obtain a dishing free planarization.

For the peripheral region, a dishing T14 of the peripheral region with a low pattern density generated by using the slurry without the selectivity is reduced compared with a dishing T12 generated by the second ILD2 CMP process, i.e., T14≦T12. Thus, a wide planarization is obtainable throughout the cell region and the peripheral region.

Detailed descriptions about the slurry and polishing conditions used for the storage node contact CMP process are explained as follows.

First, a pH factor of the slurry ranges from approximately 2 to approximately 11. Meanwhile, a polishing selectivity of the slurry is maintained in a ratio of approximately 1 part of the nitride layer to approximately 1 part of the oxide layer and the polysilicon layer or in a ratio less than the above ratio of approximately 1 part of the nitride layer to approximately 1 part of the oxide layer and the polysilicon layer, i.e., a ratio of approximately 1 part of the nitride layer to approximately 0.1 parts to approximately 0.9 of the oxide layer and the polysilicon layer. If the aforementioned slurry is used, the oxide layer used as the ILD2 26, the polysilicon layer used as the plurality of storage node contacts 29 and the PE CVD nitride layer/the LP CVD nitride layer used as the hard mask nitride layer 24 and the plurality of bit line spacers 25 are polished in the identical speed; or the polishing speed of the nitride layer comprising the cruspidal patterns gets faster than that of the oxide layer and the polysilicon layer.

An abrasive included in the slurry is selected from a group consisting of $SiO_2$, $Al_2O_3$, $CeO_2$ and $ZrO_2$. An additive added to the slurry uses $HNO_3$ and $H_3PO_4$. The selectivity can be controlled by these additives. That is, the nitride layer is polished much faster anyhow compared with the oxide layer and the polysilicon layer by adding $HNO_3$ and $H_3PO_4$ as the additives.

During performing the CMP process, a polishing pressure ranges from approximately 1 psi to approximately 10 psi and a speed of a polishing table ranges from approximately 10 rpm to approximately 100 rpm.

In accordance with the above embodiment, the storage node contact isolation process is employed twice and during performing the last CMP process, a slurry having a polishing speed of the plurality of storage node contacts at least identical with that of the plurality of cruspidal patterns or a polishing speed of the plurality of cruspidal patterns faster that of the plurality of storage node contacts is used. That is, the slurry without the selectivity or the reverse selectivity is used.

In summary, the present invention performs the CMP process that is the last process of the storage node contact isolation process by using the slurry without the selectivity or the reverse selectivity, thereby removing the plurality of cruspidal patterns at every interface of the plurality of bit line patterns BL and the plurality of storage node contacts.

Also, in accordance with the present invention, since the storage node contact CMP process is employed by using the slurry without the selectivity or the reverse selectivity, slurry residues do not exist. Accordingly, the present invention provides effects of obtaining a planarization free from an incidence of a dishing phenomenon and preventing a contact fail of the plurality of storage node contacts from being generated.

Furthermore, in accordance with the present invention, since the slurry without a selectivity during performing the storage node contact CMP process, a dishing of the peripheral region with a low pattern density is reduced compared with a dishing generated during the second ILD2 CMP process. Thus, the present invention provides an effect of performing a wide planarization throughout an entire surface of the wafer including both the cell region and the peripheral region.

The present application contains subject matter related to the Korean patent application No. KR 2004-0113542, filed in the Korean Patent Office on Dec. 28, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a plurality of storage node contacts in a semiconductor device, comprising the steps of:
    forming a first inter-layer insulation layer on a semi-finished substrate;
    forming a plurality of bit line patterns including a hard mask nitride layer on the inter-layer insulation layer;
    forming a plurality of nitride based bit line spacers in contact with both lateral sides of the plurality of bit line patterns;
    forming a second inter-layer insulation layer filling gaps between the plurality of bit line patterns;
    planarizing the second inter-layer insulation layer by performing a first chemical mechanical polishing process to the second inter-layer insulation layer two times until the polishing is stopped on surfaces of the plurality of bit line patterns;
    forming a plurality of storage node contact holes opening a surface of the substrate between the plurality of bit line patterns by selectively etching the first and the second inter-layer insulation layers;
    forming a conductive layer filling the plurality of storage node contact holes;
    forming a plurality of storage node contacts by performing an etch back to the conductive layer; and
    additionally performing a second chemical mechanical polishing process to the second inter-layer insulation layer to remove the plurality of cruspidal patterns generated during performing the etch back to the conductive layer by using a slurry having a polishing speed identical with surrounding materials of the cruspidal patterns,
    wherein a pH of the slurry used for the second chemical mechanical polishing process ranges from approximately 2 to approximately 11.

2. The method of claim 1, wherein the second chemical mechanical polishing process uses a slurry capable of polishing the second inter-layer insulation layer, the plurality of storage node contacts and the hard mask nitride layer/the bit line spacers in the identical speed.

3. The method of claim 1, wherein the second chemical mechanical polishing process uses a slurry with a polishing selectivity of approximately 1 part of the hard mask nitride layer/the plurality of bit line spacers to approximately 1 part of the second inter-layer insulation layer and the plurality of storage node contacts.

4. The method of claim 1, wherein the plurality of storage node contacts are formed by using a polysilicon layer and the second inter-layer insulation layer is formed by using an oxide layer.

5. The method of claim 1, wherein an abrasive of the slurry is selected from a group consisting of silicon oxide ($SiO_2$), aluminum oxide ($Al_2O_3$), cerium oxide ($CeO_2$) and a zirconium oxide ($ZrO_2$); and an additive uses one of $HNO_3$ and $H_3PO_4$.

6. The method of claim 5, wherein a polishing pressure during the second chemical mechanical polishing process ranges from approximately 1 psi to approximately 10 psi and a speed of a polishing table ranges from approximately 10 rpm to approximately 100 rpm.

7. The method of claim 1, wherein the first chemical mechanical polishing process comprises the steps of:

performing a first chemical mechanical polishing process to the second inter-layer insulation layer until the second inter-layer insulation layer remains on upper portions of the plurality of bit line patterns in a predetermined thickness; and performing a second chemical mechanical polishing process to the second inter-layer insulation layer until surfaces of the plurality of bit line patterns are exposed.

8. The method of claim 7, wherein the first chemical mechanical polishing process uses a slurry of which pH ranges from approximately 6 to approximately 11 and the above slurry is a slurry having a polishing selectivity of approximately 1 part of the second inter-layer insulation layer to approximately 20 parts to approximately 50 parts of the hard mask nitride layer.

9. The method of claim 8, wherein an abrasive included in the slurry is selected from a group consisting of $SiO_2$, $Al_2O_3$, $CeO_2$ and $ZrO_2$.

10. The method of claim 7, wherein during performing the first chemical mechanical polishing process, a polishing pressure ranges from approximately 1 psi to approximately 10 psi and a speed of a polishing table ranges from approximately 10 rpm to approximately 100 rpm.

11. The method of claim 8, wherein during performing the first chemical mechanical polishing process, a polishing pressure ranges from approximately 1 psi to approximately 10 psi and a speed of a polishing table ranges from approximately 10 rpm to approximately 100 rpm.

12. A method for fabricating a plurality of storage node contacts in a semiconductor device, comprising the steps of:
    forming a first inter-layer insulation layer on a substrate;
    forming a plurality of bit line patterns including a hard mask nitride layer on the inter-layer insulation layer;
    forming a plurality of nitride based bit line spacers in contact with both lateral sides of the plurality of bit line patterns;
    forming second inter-layer insulation layer filling gaps between the plurality of bit line patterns;
    planarizing the second inter-layer insulation layer by performing a first chemical mechanical polishing process to the second inter-layer insulation layer two times until the polishing is stopped on surfaces of the plurality of bit line patterns;
    forming a plurality of storage node contact holes opening a surface of the substrate between the plurality of bit line patterns by selectively etching the first and the second inter-layer insulation layers;
    forming a conductive layer filling the plurality of storage node contact holes;
    forming a plurality of storage node contacts by performing an etch back to the conductive layer; and
    additionally performing a second chemical mechanical polishing process to the second inter-layer insulation layer to remove the plurality of cruspidal patterns generated during performing the etch back to the conductive layer by using a slurry having a polishing speed faster than a polishing speed of surrounding materials of the cruspidal patterns,
    wherein a pH of the slurry used for the second chemical mechanical polishing process ranges from approximately 2 to approximately 11.

13. The method of claim 12, wherein the second chemical mechanical polishing process uses a slurry having a selectivity of the hard mask nitride layer/the bit line spacers to the second inter-layer insulation layer and the plurality of storage node contacts lower than a ratio of 1 to 1.

14. The method of claim 12, wherein an abrasive included in the slurry is selected from a group consisting of $SiO_2$, $Al_2O_3$, $CeO_2$ and $ZrO_2$; and an additive added to the slurry uses one of $HNO_3$ and $H_3PO_4$.

15. The method of claim 12, wherein during the second chemical mechanical polishing process, a polishing pressure ranges from approximately 1 psi to approximately 10 psi and a speed of a polishing table ranges from approximately 10 rpm to approximately 100 rpm.

16. The method of claim 12, wherein the plurality of storage node contacts are formed by using a polysilicon layer and the second inter-layer insulation layer is formed by using an oxide layer.

17. The method of claim 12, wherein the second chemical mechanical polishing process uses a slurry having a polishing speed of the hard mask nitride layer/the bit line spacers faster than a polishing speed of the second inter-layer insulation layer.

18. The method of claim 17, wherein an abrasive included in the slurry is selected from a group consisting of $SiO_2$, $Al_2O_3$, $CeO_2$ and $ZrO_2$; and an additive added to the slurry uses one of $HNO_3$ and $H_3PO_4$.

19. The method of claim 12, wherein the first chemical mechanical polishing process comprises the steps of:
    performing a first polishing process to the second inter-layer insulation layer until the second inter-layer insulation layer remains on upper portions of the plurality of bit line patterns in a predetermined thickness; and
    performing a second polishing process to the second inter-layer insulation layer completed with the first polishing process until surfaces of the plurality of bit line patterns are exposed.

20. The method of claim 19, wherein during the first chemical mechanical polishing process, a polishing pressure ranges from approximately 1 psi to approximately 10 psi and a speed of a polishing table ranges from approximately 10 rpm to approximately 100 rpm.

21. The method of claim 19, wherein the first chemical mechanical polishing process uses a slurry of which pH ranges from approximately 6 to approximately 11 and the above slurry is a slurry having a polishing selectivity of approximately 1 part of the second inter-layer insulation layer to approximately 20 parts to approximately 50 parts of the hard mask nitride layer.

22. The method of claim 21, wherein an abrasive included in the slurry is selected from a group consisting of $SiO_2$, $Al_2O_3$, $CeO_2$ and $ZrO_2$.

23. The method of claim 22, wherein during the first chemical mechanical polishing process, a polishing pressure ranges from approximately 1 psi to approximately 10 psi and a speed of a polishing table ranges from approximately 10 rpm to approximately 100 rpm.

* * * * *